United States Patent
Ishikawa et al.

(10) Patent No.: US 8,831,136 B2
(45) Date of Patent: Sep. 9, 2014

(54) WIRELESS APPARATUS AND DISTORTION COMPENSATING METHOD

(71) Applicant: Fujitsu Limited, Kawasaki (JP)

(72) Inventors: Hikaru Ishikawa, Kawasaki (JP); Satoshi Matsubara, Kawasaki (JP); Hideharu Shako, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/753,818

(22) Filed: Jan. 30, 2013

(65) Prior Publication Data

US 2013/0259154 A1 Oct. 3, 2013

(30) Foreign Application Priority Data

Mar. 30, 2012 (JP) .................. 2012-083170

(51) Int. Cl.
*H04K 1/02* (2006.01)
*H04L 25/03* (2006.01)
*H04L 25/49* (2006.01)
*H04B 15/00* (2006.01)

(52) U.S. Cl.
CPC .................................. *H04B 15/00* (2013.01)
USPC ........................... 375/297; 375/295; 375/296

(58) Field of Classification Search
USPC ................................. 375/295–297
See application file for complete search history.

(56) References Cited

U.S. PATENT DOCUMENTS

| 5,852,630 | A  | * | 12/1998 | Langberg et al. ............. 375/219 |
| 5,864,710 | A  | * | 1/1999  | Sands et al. .................. 710/5 |
| 6,246,286 | B1 | * | 6/2001  | Persson ......................... 330/149 |
| 6,697,436 | B1 | * | 2/2004  | Wright et al. ................. 375/296 |
| 6,836,517 | B2 |   | 12/2004 | Nagatani et al. |
| 6,907,085 | B2 |   | 6/2005  | Kubo et al. |
| 6,920,127 | B2 | * | 7/2005  | Ozluturk et al. ............. 370/342 |
| 6,967,436 | B2 | * | 11/2005 | Park ............................. 313/504 |
| 7,164,738 | B2 | * | 1/2007  | Miyamoto et al. ........... 375/346 |
| 2006/0188038 | A1 | * | 8/2006 | Shako et al. .................. 375/296 |
| 2013/0177105 | A1 | * | 7/2013 | Gonikberg et al. .......... 375/296 |

FOREIGN PATENT DOCUMENTS

| JP | 11-136302   | 5/1999  |
| JP | 2001-189685 | 7/2001  |
| JP | 2001-345718 | 12/2001 |
| JP | 2006-074539 | 3/2006  |
| JP | 2009-272762 | 11/2009 |

* cited by examiner

*Primary Examiner* — Sam K Ahn
*Assistant Examiner* — James M Perez
(74) *Attorney, Agent, or Firm* — Fujitsu Patent Center

(57) ABSTRACT

A wireless apparatus includes amplifying systems each including a storing unit storing a distortion compensation coefficient for compensation for a nonlinear distortion of one or more transmission signals, a compensator compensating for the nonlinear distortion using the distortion compensation coefficient stored in the storing unit, and an amplifier amplifying the transmission signal after distortion compensation. The wireless apparatus further includes a switch that selects feedback signals corresponding to the transmission signals output from the amplifying systems, a subtractor that derives one or more differences between the feedback signal selected in the switch and the transmission signal, a first calculator that derives a distortion compensation coefficient that restricts the difference derived in the subtractor, and a switch controller that controls a length of time during which the feedback signal is selected in the switch depending on magnitude of distortion of the transmission signal output from the amplifying system.

10 Claims, 10 Drawing Sheets

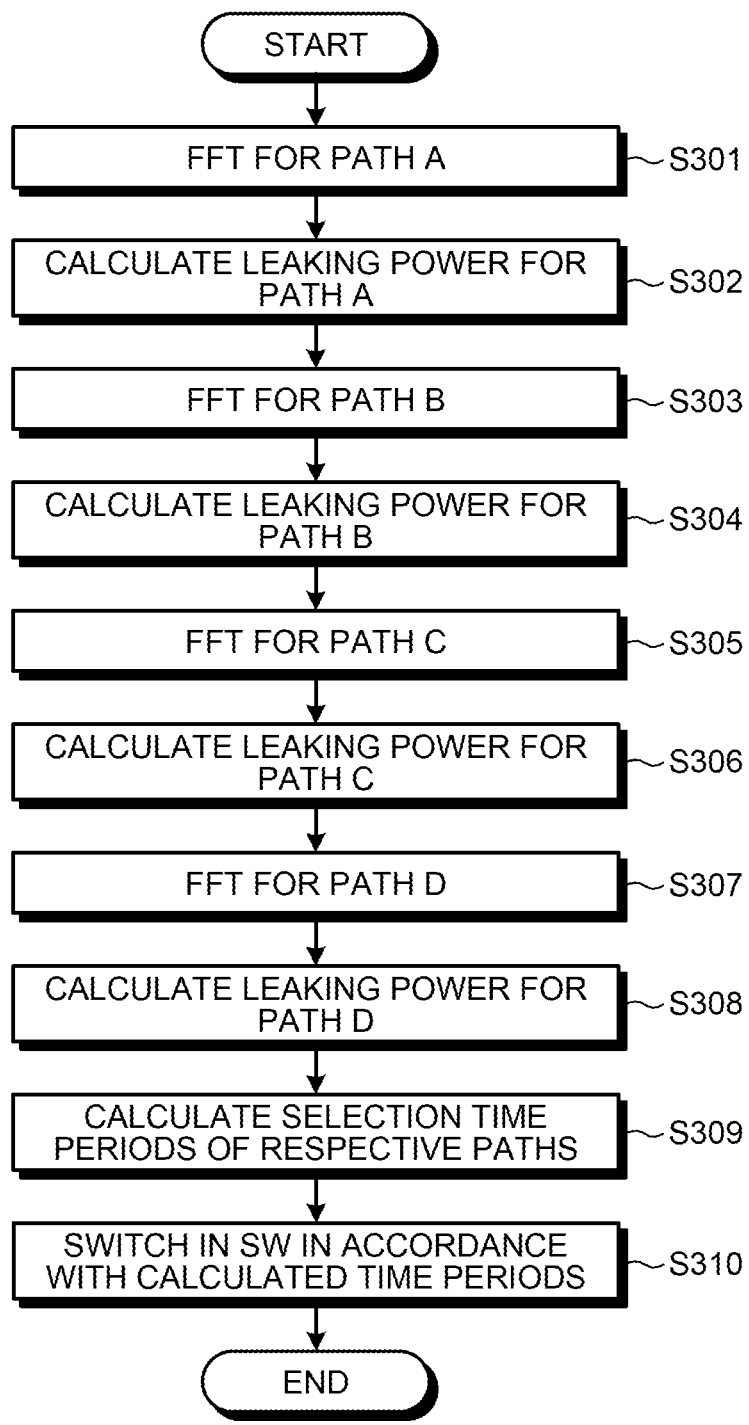

WIRELESS APPARATUS AND DISTORTION COMPENSATING METHOD

CROSS-REFERENCE TO RELATED APPLICATION(S)

This application is based upon and claims the benefit of priority of the prior Japanese Patent Application No. 2012-083170, filed on Mar. 30, 2012, the entire contents of which are incorporated herein by reference.

FIELD

The embodiments discussed herein are directed to a wireless apparatus and a distortion compensating method.

BACKGROUND

In recent years, a wireless apparatus such as a mobile phone and a smartphone comes to have a digital communication function, and data transmission is performed with high efficiency. When a wireless apparatus which sends data employs a multi-phase modulation system for data transmission, preferably an amplification characteristic of a transmission power amplifier is linearized to suppress a nonlinear distortion and to reduce leakage power to adjacent channels.

When an amplifier with low linearity is employed in an effort to improve power efficiency, it is preferable that a nonlinear distortion that occurs due to the low linearity be compensated. To this end, wireless apparatuses are provided with a distortion compensator that compensates for the nonlinear distortion of the power amplifier.

For example, a transmission signal is converted into two signals, i.e., an I signal and a Q signal, by an S/P (Serial/Parallel) converter. Then, the I signal and the Q signal are subjected to amplification processing. Thereafter, a part of the amplified signal is fed back as a feedback signal. The distortion compensator compares the I signal and the Q signal with the feedback signals, and calculates a distortion compensation coefficient so that a difference between the I signal/Q signal and the feedback signal is zero. Then, the distortion compensator performs distortion compensation by multiplying the I signal and Q signal, i.e., the converted transmission signal, with the distortion compensation coefficient. The distortion compensator compares the transmission signal before the distortion compensation with a feedback signal obtained by extracting a part of a signal amplified after the distortion compensation, and sequentially updates the distortion compensation coefficient so that the difference between these signals is zero. As to an example of such a conventional technique, see Japanese Laid-open Patent Publication No. 2001-189685, for example.

However, the conventional technique does not consider reducing a time taken for compensating the distortion of signals output from a plurality of amplifiers.

A wireless apparatus including a plurality of amplifiers may update the distortion compensation coefficient for each amplifier by switching between feedback signals from the amplifiers equally in a time-divisional manner, and comparing each feedback signal with a corresponding transmission signal.

Depending on the states of distortion in output signals from the plurality of amplifiers, a time taken for distortion compensation of the output signals can be long. For example, assume that distortion compensation is performed for two amplifiers; and an output signal from one amplifier experiences a relatively large distortion while an output signal from the other amplifier experiences no distortion. In this case, if the distortion compensation coefficients for the two amplifiers are updated equally in a time-divisional manner, an assigned time slot is not long enough for the signal experiencing a relatively large distortion for updating the distortion compensation coefficient, and hence, the update will be insufficient. On the other hand, the distortion compensation coefficient of the signal not experiencing a distortion is also updated, which is unnecessary. Consequently, as to the amplifiers as a whole, a time taken for the distortion compensation of the output signals may become long, because the distortion compensation of the output signal from the amplifier which experiences a relatively large distortion may take a long time until it finishes.

SUMMARY

According to an aspect of an embodiment, a wireless apparatus includes a plurality of amplifying systems. Each of the amplifying systems includes a storing unit that stores a distortion compensation coefficient for use in compensation for a nonlinear distortion of one or more transmission signals, a compensator that compensates for the nonlinear distortion of the transmission signal with use of the distortion compensation coefficient stored in the storing unit, and an amplifier that amplifies the transmission signal subjected to distortion compensation in the compensator. The wireless apparatus further includes a switch that selects a plurality of feedback signals corresponding to the plurality of transmission signals output from the plurality of amplifying systems sequentially in a time-divisional manner, a subtractor that derives one or more differences between the feedback signal selected in the switch and the transmission signal, corresponding to the feedback signal, before distortion compensation in the compensator, a first calculator that derives a distortion compensation coefficient that restricts the difference derived in the subtractor and updates the distortion compensation coefficient stored in the storing unit in the corresponding amplifying system by the derived distortion compensation coefficient, and a switch controller that controls a length of time during which each of the feedback signals is selected in a time-divisional manner in the switch depending on magnitude of a distortion of each of the plurality of transmission signals output from the plurality of amplifying systems.

According to another aspect of an embodiment, a distortion compensating method includes (a) executing in each of a plurality of amplifying systems, (a1) reading a distortion compensation coefficient from a storing unit that stores the distortion compensation coefficient for use in compensation for a nonlinear distortion of one or more transmission signals and compensating for the nonlinear distortion of the transmission signal with use of the read distortion compensation coefficient, and (a2) amplifying the transmission signal subjected to distortion compensation, (b) selecting a plurality of feedback signals corresponding to the plurality of transmission signals output from the plurality of amplifying systems sequentially in a time-divisional manner, (c) deriving a difference between the selected feedback signal and the transmission signal, corresponding to the feedback signal, before the distortion compensation, (d) deriving a distortion compensation coefficient that restricts the derived difference and updating a storing unit in the corresponding amplifying system by the derived distortion compensation coefficient, and (e) controlling a length of time during which each of the feedback signals is selected in a time-divisional manner depending on magnitude of a distortion of each of the plurality of transmission signals output from the plurality of amplifying systems.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 illustrates a flowchart of another exemplary process performed by the wireless apparatus according to the third embodiment.

DESCRIPTION OF EMBODIMENTS

Preferred embodiments of the present invention will be explained with reference to accompanying drawings. It is to be noted that a disclosed technique is not limited by these embodiments.

[a] First Embodiment

Figure 1:
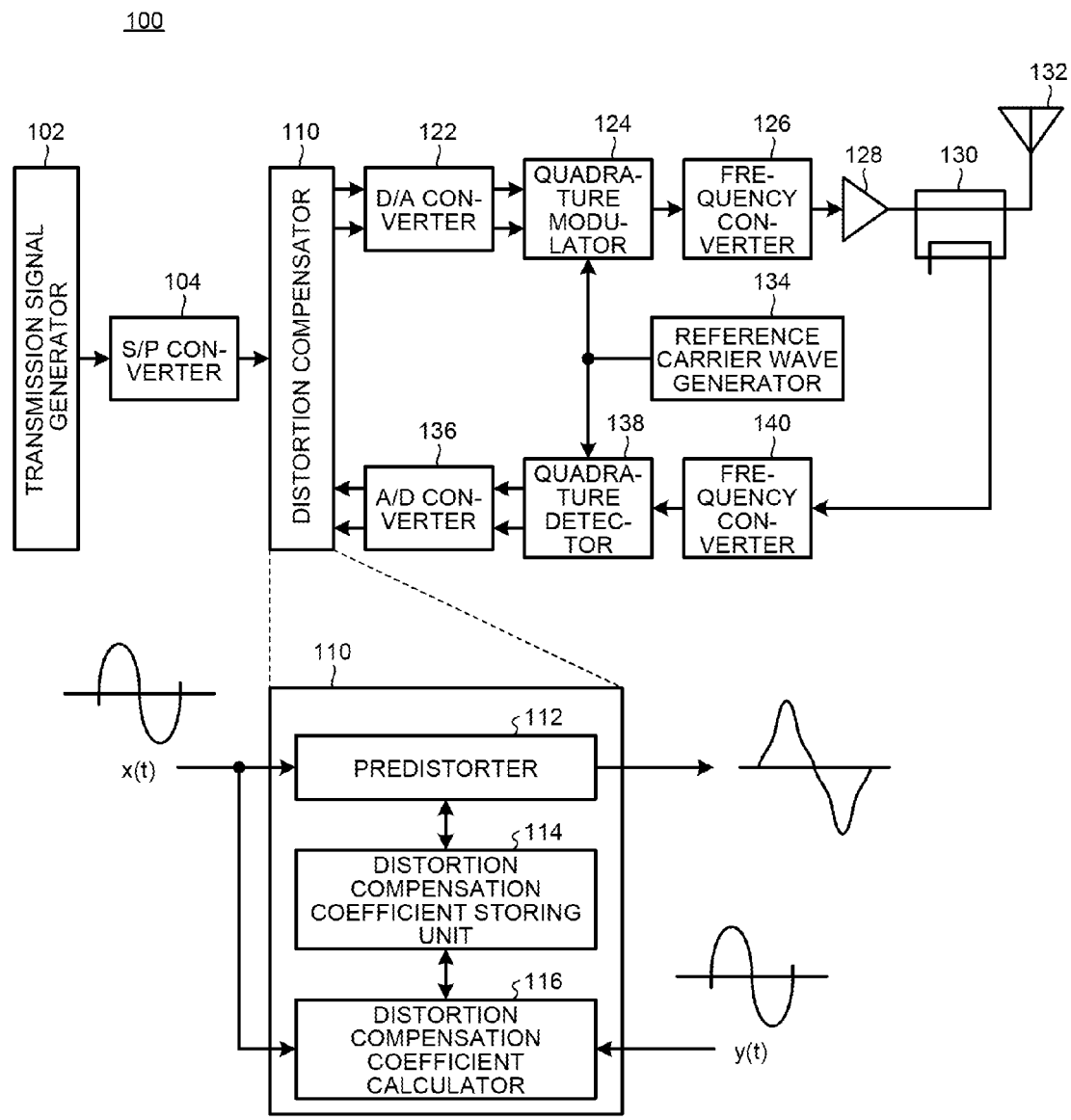
FIG. 1 illustrates an exemplary configuration of a wireless apparatus according to a first embodiment.

FIG. 1 illustrates a configuration of a wireless apparatus according to a first embodiment. As illustrated in FIG. 1, a wireless apparatus 100 includes a transmission signal generator 102, a serial/parallel converter (S/P converter) 104, a distortion compensator 110, and a D (Digital)/A (Analog) converter 122. The wireless apparatus 100 also includes a quadrature modulator 124, a frequency converter 126, an amplifier 128, a directional coupler 130, an antenna 132, and a reference carrier wave generator 134. The wireless apparatus 100 further includes an A/D converter 136, a quadrature detector 138, and a frequency converter 140. The distortion compensator 110 includes a predistorter 112, a distortion compensation coefficient storing unit 114, and a distortion compensation coefficient calculator 116. The distortion compensator 110 is achieved, e.g., by a DSP (Digital Signal Processor).

The transmission signal generator 102 generates a serial digital data string to be transmitted from the wireless apparatus 100. The serial/parallel converter 104 divides the digital data string generated in the transmission signal generator 102 alternately on a bit-by-bit basis and converts it into 2 signals, i.e., an in-phase component signal (I signal) and a quadrature component signal (Q signal).

The D/A converter 122 converts each of the I signal and the Q signal into an analog baseband signal. The quadrature modulator 124 performs a quadrature modulation by multiplying the I signal and the Q signal (transmission baseband signals) output from the D/A converter 122 by a reference carrier wave generated in the reference carrier wave generator 134 and a carrier wave having a phase shifted by 90 degrees from the phase of the reference carrier wave, respectively, and adding the multiplication results.

The frequency converter 126 mixes the quadrature signal output from the quadrature modulator 124 with a local oscillation signal and converts the frequency of the mixed signal into a radio frequency. The amplifier 128 amplifies the radio frequency signal output from the frequency converter 126 and radiates the signal in the air through the directional coupler 130 and the antenna 132.

The directional coupler 130 feeds a part of the transmission signal back to the frequency converter 140 and inputs the signal in the frequency converter 140. The frequency converter 140 converts the frequency of the feedback signal. The quadrature detector 138 performs a quadrature detection by multiplying the feedback signal output from the frequency converter 140 by the reference carrier wave generated in the reference carrier wave generator 134 and the signal having a phase shifted by 90 degrees from the phase of the reference carrier wave to reproduce the I signal and the Q signal as the baseband signals on the transmission side. The A/D converter 136 converts the feedback signals output from the quadrature detector 138 into digital signals and inputs the digital signals in the distortion compensator 110.

The distortion compensation coefficient storing unit 114 stores distortion compensation coefficients h(pi) corresponding to power values pi (i=0 to 1023) of a transmission signal x(t). The predistorter 112 performs distortion compensation processing (predistortion) on the transmission signal with the use of a distortion compensation coefficient h(pi) corresponding to a power level of the transmission signal. The distortion compensation coefficient calculator 116 compares the transmission signal x(t) with a demodulated signal (feedback signal) y(t) demodulated in the quadrature detector 138, calculates a distortion compensation coefficient h(pi) so that a difference between these signals is zero, and updates the distortion compensation coefficient stored in the distortion compensation coefficient storing unit 114.

In this manner, the distortion compensator 110 updates the distortion compensation coefficient in an adaptive manner so that a difference between the feedback signal which is a part of the signal amplified in the amplifier 128 and the transmission signal before distortion compensation is zero.

Figure 2:
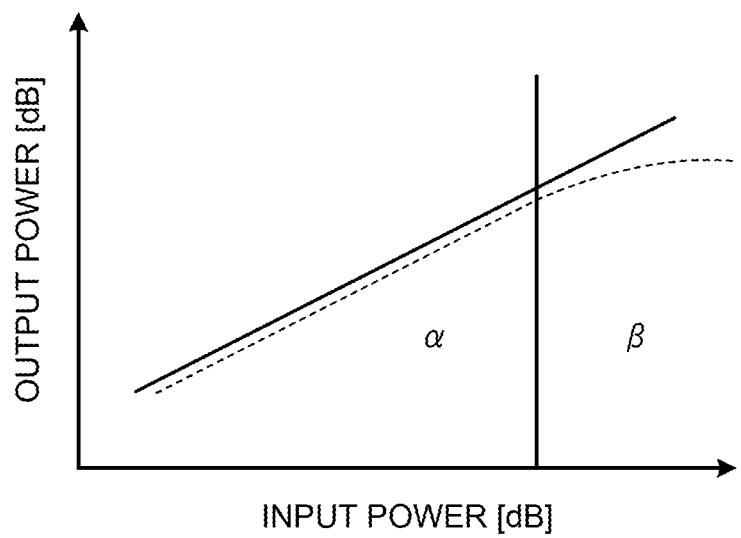
FIG. 2 illustrates an input/output characteristic of an amplifier.
Figure 3:
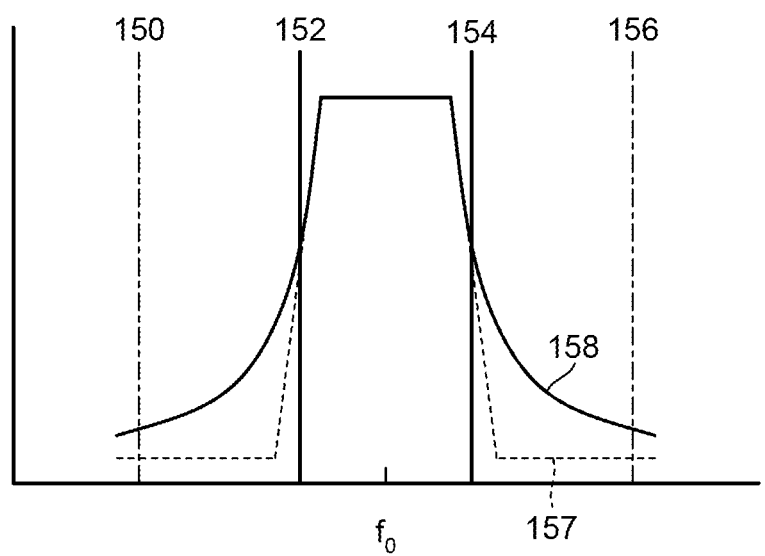
FIG. 3 describes a nonlinear distortion generated by a nonlinear characteristic.

Next, an input/output characteristic of the amplifier and a nonlinear distortion generated by a nonlinear characteristic will be described. FIG. 2 illustrates an input/output characteristic of the transmission power amplifier. FIG. 3 describes a nonlinear distortion generated by a nonlinear characteristic.

For example, in mobile communication such as W-CDMA (Wideband Code Division Multiple Access), transmission power of the wireless apparatus is as large as 10 mW to tens of W, and an input/output characteristic (which has a distortion function f(p)) of the amplifier 128 has a nonlinear characteristic as illustrated by a dotted line in FIG. 2. A nonlinear distortion is generated by this nonlinear characteristic, and as for a spectrum of frequencies around a transmission frequency $f_0$, the side lobes rise from a characteristic illustrated by a dashed line 157 to a characteristic illustrated by a solid line 158 in FIG. 3. Thus, the transmission signal leaks to adjacent channels, which causes an adjacent channel interference. That is, due to the nonlinear distortion illustrated in FIG. 2, power of the transmission signal leaking to the adjacent frequency channels becomes large as illustrated in FIG. 3.

An ACPR (Adjacent Channel Power Ratio) indicates the magnitude of leaking power. In FIG. 3, ACPR is a ratio between adjacent leaking power leaking to adjacent channels represented by a spectrum area between a frequency band 150 and a frequency band 156 to power of a channel of interest represented by a spectrum area between a frequency band 152 and a frequency band 154. Such leaking power is strictly regulated since it becomes noise for the other channels and degrades a communication quality of the channels.

The amount of leaking power is small in a linear region (linear region α in FIG. 2) of the power amplifier and is large in a nonlinear region β, for example. Thus, in a high-power transmission power amplifier, it is preferable to increase the linear region α. However, in order to increase the linear region, the amplifier needs to exhibit higher performance than actually wanted performance. This may be a disadvantage in terms of cost and size of the apparatus. Under such circumstances, the distortion compensator 110, which compensates for a distortion of transmission power, is provided in the wireless apparatus 100.

Figure 4:
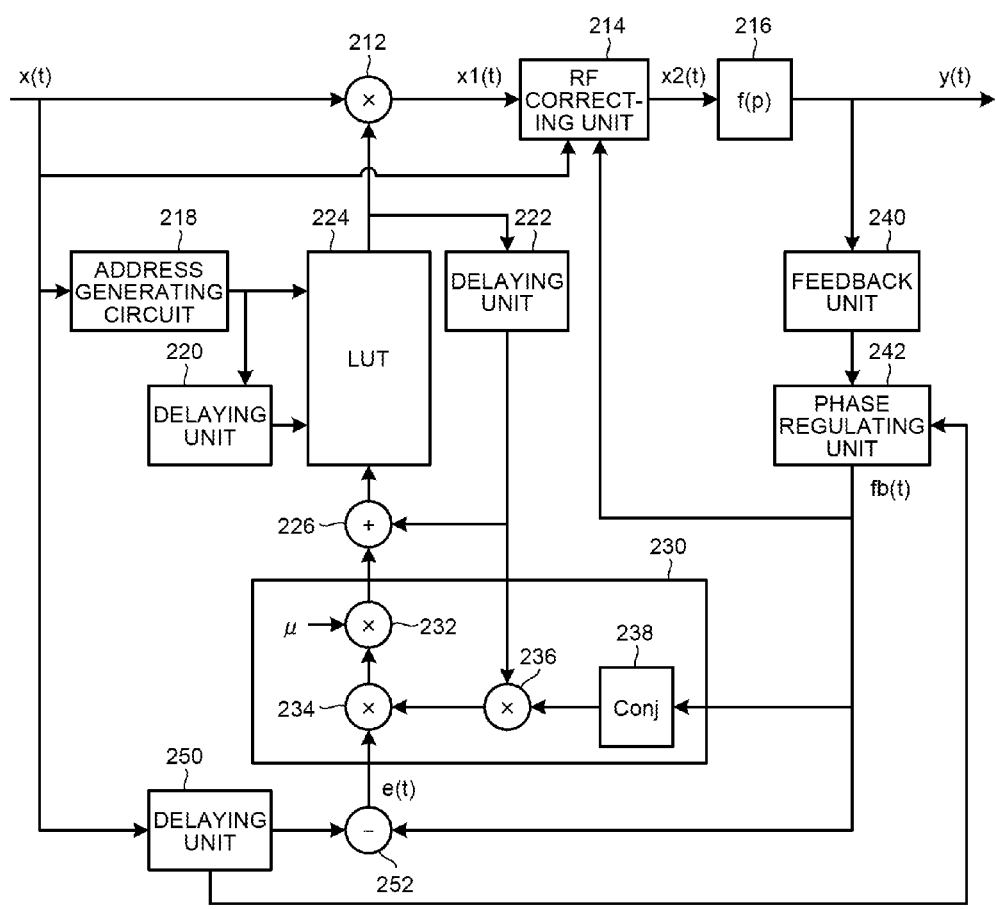
FIG. 4 illustrates an exemplary configuration of a distortion compensator.

Next, an exemplary configuration of the distortion compensator 110 will be described. FIG. 4 illustrates an exemplary configuration of the distortion compensator 110. As illustrated in FIG. 4, the distortion compensator 110 includes a multiplier 212, an RF correcting unit 214, a distortion function calculator 216, an address generating circuit 218, delaying units 220 and 222, an LUT (Look Up Table) 224, and an adder 226. The distortion compensator 110 also includes a distortion compensation coefficient calculator 230, a feedback unit 240, a phase regulating unit 242, a delaying unit 250, and a subtractor 252. The distortion compensation coefficient calculator 230 includes multipliers 232, 234, and 236 and a conjugate complex signal outputting unit 238.

The multiplier 212 in FIG. 4 corresponds to the predistorter 112 in FIG. 1. The multiplier 212 multiplies a transmission signal x(t) by a distortion compensation coefficient hn−1(p). The distortion function calculator 216 in FIG. 4 corresponds to the amplifier 128 in FIG. 1.

Also, the feedback unit 240 in FIG. 4 corresponds to a part including the directional coupler 130, the frequency converter 140, the quadrature detector 138, and the A/D converter 136 in FIG. 1. The LUT 224 in FIG. 4 corresponds to the distortion compensation coefficient storing unit 114 in FIG. 1. The distortion compensation coefficient calculator 230 in FIG. 4 corresponds to the distortion compensation coefficient calculator 116 in FIG. 1.

In FIG. 4, the LUT 224 stores distortion compensation coefficients that cancel distortions of the distortion function calculator 216 (amplifier) in two-dimensional address locations corresponding to respective discrete power values of a transmission signal x(t). When a transmission signal x(t) is input, the address generating circuit 218 calculates a power value p (=x2(t)) of the transmission signal x(t) and generates an address in a one-dimensional direction such as an X-axial direction address uniquely corresponding to the calculated power value p (=x2(t)) of the transmission signal x(t). At the same time, the address generating circuit 218 derives a difference ΔP from a power value p1 (=x2(t−1)) of a transmission signal x(t−1) at a previous time point (t−1) stored in the address generating circuit 218 and generates an address in an another-dimensional direction such as a Y-axial direction address uniquely corresponding to the calculated difference ΔP.

The distortion compensator 110 outputs a storage location of the LUT 224 specified by the X-axial direction address P and the Y-axial direction address ΔP generated in the address generating circuit 218 as specifying information of a readout address (AR). Subsequently, a distortion compensation coefficient hn−1(p) stored in this readout address is read out from the LUT 224 and is used for distortion compensation processing in the multiplier 212. The RF correcting unit 214 performs processing such as frequency conversion processing of a distortion-compensated signal based on a signal after the distortion compensation in the multiplier 212, a signal without distortion compensation, and a signal subjected to phase regulation in the phase regulating unit 242.

An update value for update of a distortion compensation coefficient stored in the LUT 224 is calculated in the distortion compensation coefficient calculator 230. Specifically, the distortion compensation coefficient calculator 230 is configured to include the conjugate complex signal outputting unit 238 and the multipliers 232, 234, and 236. The subtractor 252 outputs a difference e(t) between the transmission signal x(t) delayed in the delaying unit 250 and a demodulated feedback signal y(t) (feedback signal).

The multiplier 236 multiplies the distortion compensation coefficient hn−1(p) by y*(t) and obtains an output u*(t) (=hn−1(p)y*(t)). The multiplier 234 multiplies the difference output e(t) of the subtractor 252 by u*(t). The multiplier 232 multiplies a step size parameter μ by an output of the multiplier 234.

Subsequently, the adder 226 adds the distortion compensation coefficient hn−1(p) to an output μe(t)u*(t) of the multiplier 232 to obtain an update value of the LUT 224. The update value is stored in a writing address (AW) specified by the X-axial direction address and the Y-axial direction address as an address uniquely corresponding to the power value p (=x2(t)) of the transmission signal generated in the address generating circuit 218.

Meanwhile, the readout address (AR) described above and the writing address (AW) are the same address. However, since it takes calculating time and the like until the update value is obtained, the readout address is delayed in the delaying unit 220 and is used as the writing address.

The delaying units 220, 222, and 250 add delay time D from the input of the transmission signal x(t) to the input of the demodulated feedback signal y(t) in the subtractor 252 to the transmission signal. The delay time D set in the delaying units 220, 222, and 250 is determined so that D=D0+D1 may be satisfied where D0 is delay time in the distortion function calculator 216 (amplifier), and D1 is delay time in the feedback unit 240.

By the above configuration, the following calculations are performed.

$$hn(p)=hn-1(p)+\mu e(t)u^*(t)$$

$$e(t)=x(t)-y(t)$$

$$y(t)=hn-1(p)x(t)f(p)$$

$$u^*(t)=x(t)f(p)=hn-1(p)y^*(t)$$

$$p=|x(t)|2$$

In the above equations, x, y, f, h, u, and e are complex numbers, and * is a conjugate complex number. By the above calculation processing, the distortion compensation coefficient h(p) is updated so that the difference signal e(t) between the transmission signal x(t) and the demodulated feedback signal y(t) may be minimum and results in an optimal distortion compensation coefficient value, and the distortion of the amplifier 128 is compensated.

[b] Second Embodiment

Figure 5:
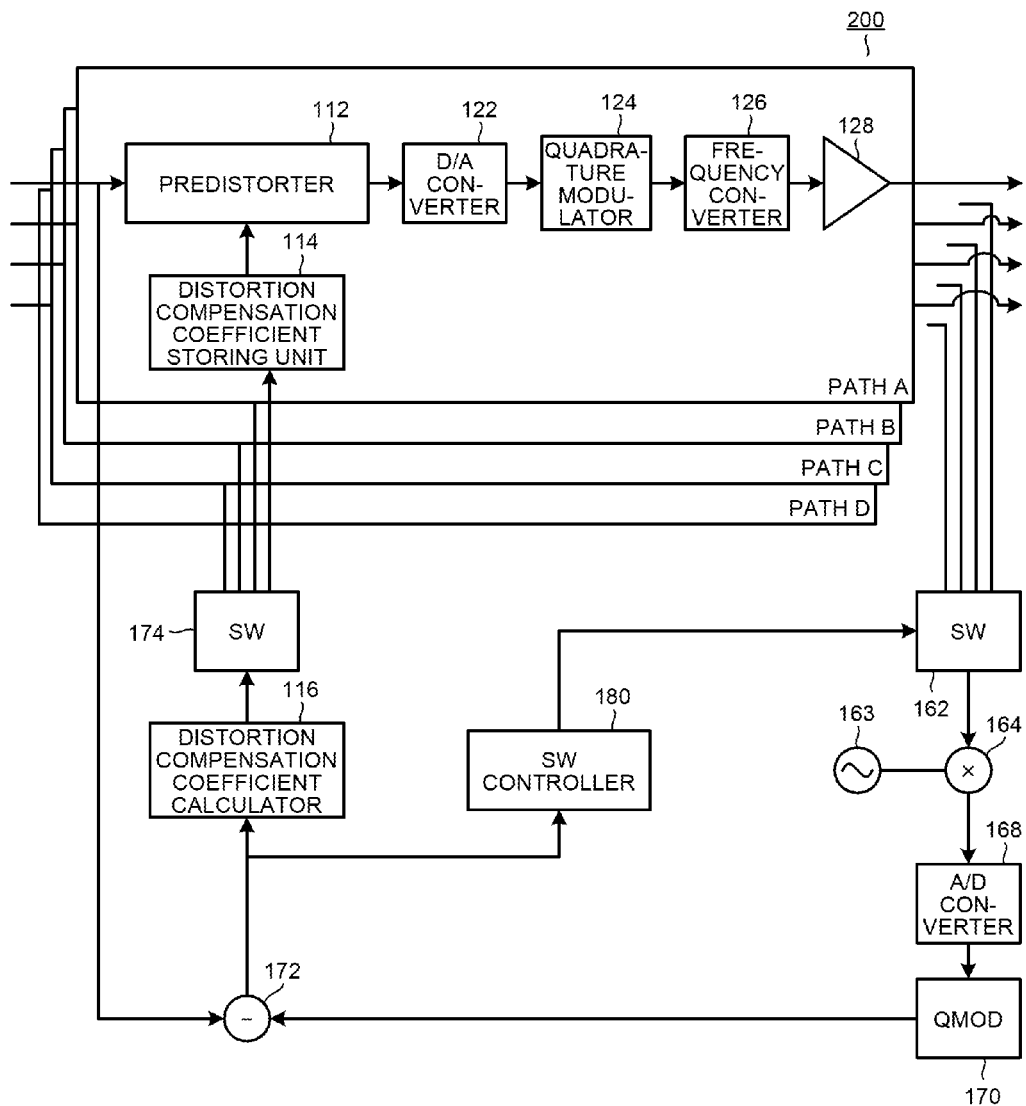
FIG. 5 illustrates an exemplary configuration of a wireless apparatus according to a second embodiment.

The wireless apparatus according to the first embodiment may include a plurality of amplifying systems (paths) each including the predistorter 112, the D/A converter 122, the quadrature modulator 124, the frequency converter 126, the amplifier 128, and the like. Description in this respect will be provided as a second embodiment. FIG. 5 illustrates an exemplary configuration of a wireless apparatus according to the second embodiment.

As illustrated in FIG. 5, the wireless apparatus 200 includes a plurality of amplifying systems (a path A, a path B, a path C, and a path D). Since the path A, the path B, the path C, and the path D are similarly configured, the path A will be described as a representative.

The path A includes the predistorter 112, the distortion compensation coefficient storing unit 114, the D/A converter 122, the quadrature modulator 124, the frequency converter 126, and the amplifier 128. Since the respective configurations of these components have been described with respect to FIG. 1, duplicate description is not provided.

The wireless apparatus 200 includes a switch (SW) 162, a reference carrier wave generator 163, a multiplier 164, an A/D converter 168, a modulator (QMOD) 170, a subtractor 172, the distortion compensation coefficient calculator 116, a switch (SW) 174, and an SW controller 180. The paths A to D have in common the switch (SW) 162, the reference carrier wave generator 163, the multiplier 164, the A/D converter 168, the modulator (QMOD) 170, the subtractor 172, the distortion compensation coefficient calculator 116, the switch (SW) 174, and the SW controller 180.

The switch 162 selects feedback signals as parts of signals output from the paths A to D sequentially in a time-divisional manner. The multiplier 164 multiplies a reference carrier wave output from the reference carrier wave generator 163 by a feedback signal selected in the switch 162. The subtractor 172 derives a difference between the feedback signal output from the multiplier 164 and undergoing A/D conversion processing and modulation processing and a transmission signal, corresponding to this feedback signal, before distortion compensation in the predistorter 112. The distortion compensation coefficient calculator 116 derives a distortion compensation coefficient that restricts the difference derived in the subtractor 172 and updates a distortion compensation coefficient stored in the distortion compensation coefficient storing unit 114 in a corresponding path by the derived distortion compensation coefficient. Specifically, the switch 174 stores the distortion compensation coefficient output from the distortion compensation coefficient calculator 116 in the distortion compensation coefficient storing unit 114 in a corresponding path among the paths A to D to update the distortion compensation coefficient.

In this manner, by providing the switch 162 and the switch 174, the plurality of paths A to D may have the reference carrier wave generator 163, the multiplier 164, the A/D converter 168, the modulator (QMOD) 170, the subtractor 172, the distortion compensation coefficient calculator 116, and the like in common.

The SW controller 180 controls the length of time during which each feedback signal is selected in a time-divisional manner in the switch 162 depending on the magnitude of a distortion of each of the plurality of transmission signals output from the plurality of paths A to D. For example, the SW controller 180 controls the length of time during which each feedback signal is selected in a time-divisional manner in the switch 162 depending on the magnitude of the difference derived in the subtractor 172. More specifically, the SW controller 180 compares a plurality of differences corresponding to the plurality of feedback signals derived in the subtractor 172 with one another and makes the length of time (referring time of a feedback signal) during which the feedback signal is selected in a time-divisional manner in the switch 162 longer for a feedback signal from an amplifying system having a larger difference. In other words, the SW controller 180 provides an amplifying system having a larger difference with a larger number of times of updating of the distortion compensation coefficient stored in the distortion compensation coefficient storing unit 114 (LUT).

Figure 6:
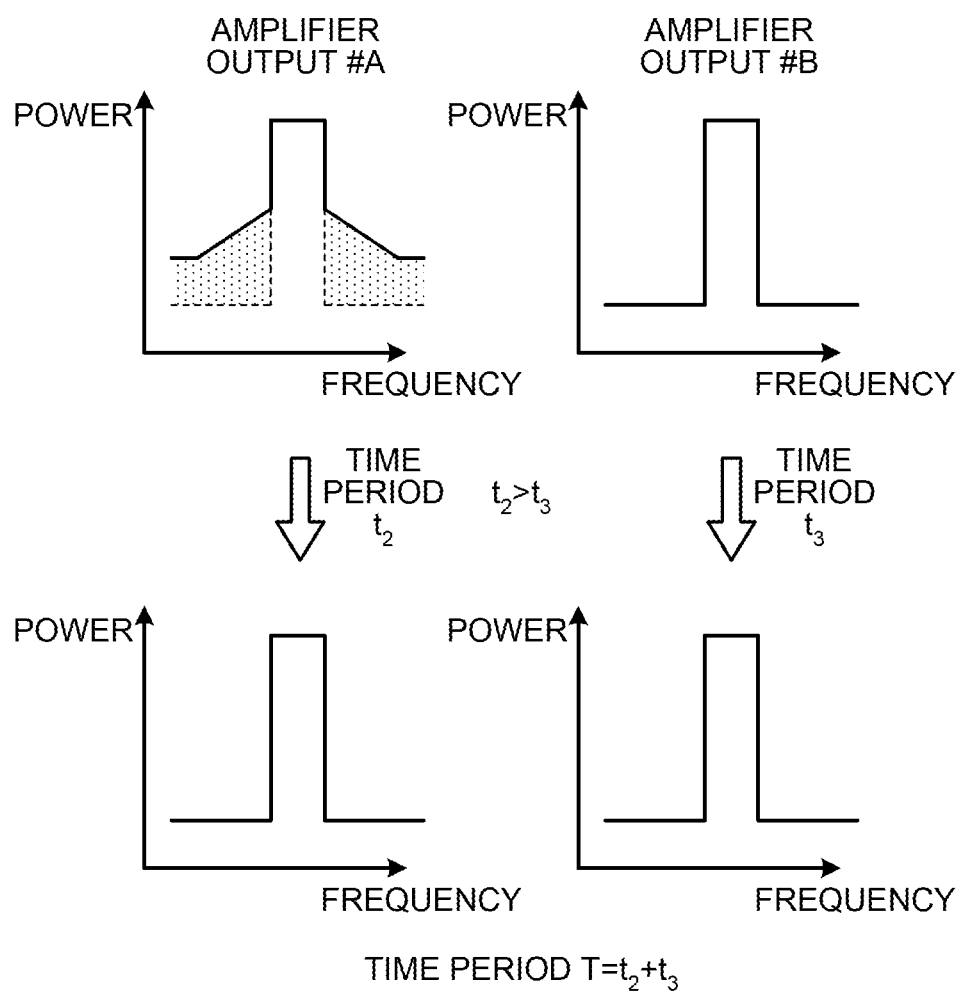
FIG. 6 illustrates an example of update time periods in an LUT.

Control in the SW controller 180 will be described further in details. FIG. 6 illustrates an example of update time periods in the LUT. In FIG. 6, an example with two paths A and B is illustrated for simplicity of description. As illustrated in frequency spectra at the upper portion of FIG. 6, it is assumed that a signal output from an amplifier of the path A has a relatively large distortion (side lobes rise) and that a signal output from an amplifier of the path B experiences almost no distortion (side lobes do not rise).

In this case, the SW controller 180 compares a difference of the path A output from the subtractor 172 with a difference of the path B and determines that the signal output from the amplifier of the path A has a larger distortion than the signal output from the amplifier of the path B. The SW controller 180 then sets time period $t_2$ during which the signal output from the amplifier of the path A is selected in the switch 162 to be longer than time period $t_3$ during which the signal output from the amplifier of the path B is selected ($t_2 > t_3$). The sum of $t_2$ and $t_3$ is time period T of 1 cycle for sequentially selecting the signal of the path A and the signal of the path B.

By controlling the selection time periods in a manner of $t_2 > t_3$, update of the distortion compensation coefficient is performed frequently for the signal of the path A, which experiences a relatively large distortion, and consequently, sufficient distortion compensation is performed (the rise of the side lobes is significantly decreased) as illustrated in a frequency spectrum at the lower portion of FIG. 6. On the other hand, update of the distortion compensation coefficient is not performed so frequently for the signal of the path B, which experiences almost no distortion, but since there is nearly no distortion from the beginning, the rise of the side lobes does not occur.

Figure 7:
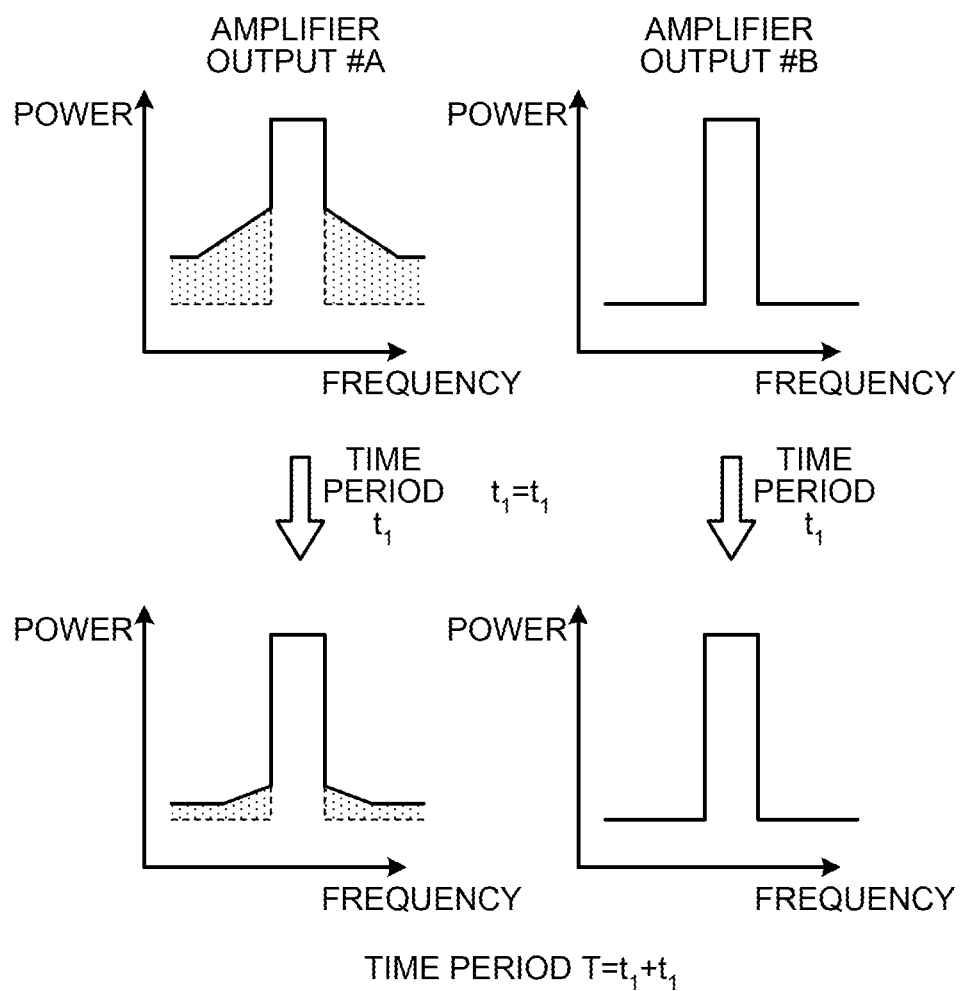
FIG. 7 illustrates a comparative example of update time periods in the LUT.

A comparative example of update in the LUT in a case where the SW controller 180 is not provided will be described. FIG. 7 illustrates a comparative example of update time periods in the LUT. In FIG. 7, two paths A and B are illustrated, similarly to FIG. 6, for the simplicity of description. As illustrated in frequency spectra at the upper portion of FIG. 7, it is assumed that a signal output from an amplifier of the path A has a relatively large distortion (side lobes rise) and that a signal output from an amplifier of the path B experiences almost no distortion (side lobes do not rise).

In the comparative example, the switch 162 selects the signal output from the amplifier of the path A and the signal output from the amplifier of the path B equally in a time-divisional manner. That is, in the comparative example, each of a time period during which the signal output from the amplifier of the path A is selected in the switch 162 and a time period during which the signal output from the amplifier of the path B is selected in the switch 162 is set to time period $t_1$.

The sum of $t_1$ and $t_1$ is time period T of 1 cycle for sequentially selecting the signal of the path A and the signal of the path B.

When the signal of the path A and the signal of the path B are switched by equal time allocation, update of the distortion compensation coefficient is not performed sufficiently for the signal of the path A, which experiences a relatively large distortion as illustrated in a frequency spectrum at the lower portion of FIG. 7. Consequently, sufficient distortion compensation is not performed for the signal of the path A (the rise of the side lobes is slightly decreased but remains even after distortion compensation since distortion compensation is not sufficient). On the other hand, the rise of the side lobes does not occur for the signal of the path B, which experiences nearly no distortion, since there is almost no distortion from the beginning; however update of the distortion compensation coefficient is performed frequently for the signal of the path B as well, which is actually unnecessary. As a result, time taken for compensating for distortions of the signal of the path A and the signal of the path B becomes long.

Figure 8:
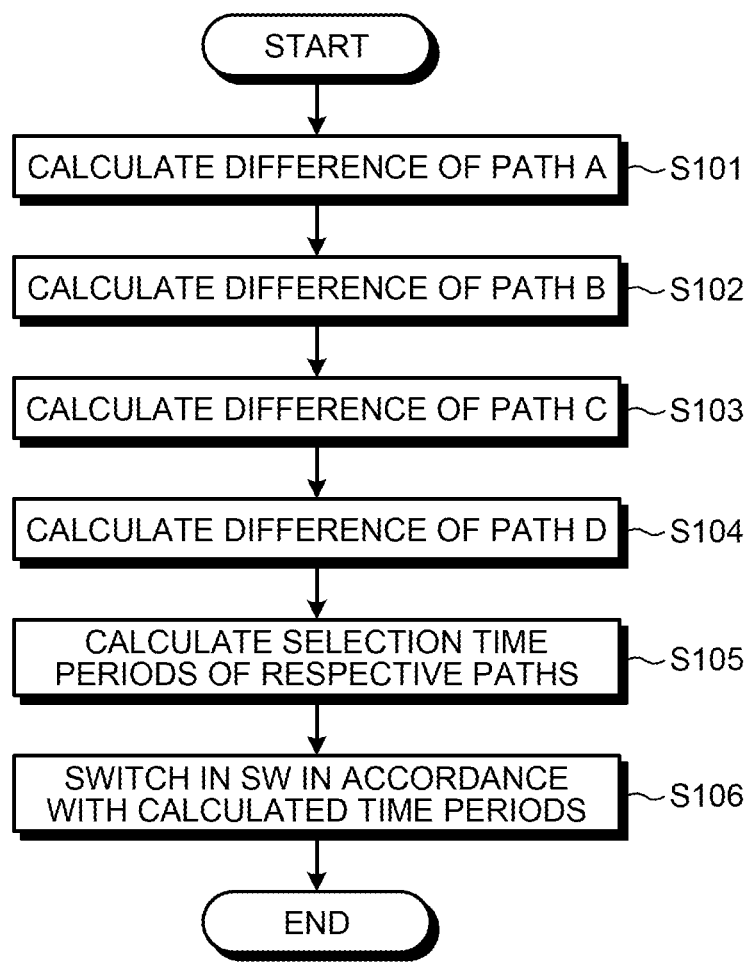
FIG. 8 illustrates a flowchart of an exemplary process performed by the wireless apparatus according to the second embodiment.

Next, a flowchart of a process performed by the wireless apparatus 200 according to the second embodiment will be described. FIG. 8 illustrates a flowchart of an exemplary process performed by the wireless apparatus 200 according to the second embodiment. As illustrated in FIG. 8, the subtractor 172 first calculates a difference between a feedback signal and a transmission signal before distortion compensation in the path A (step S101). The subtractor 172 then calculates a difference between a feedback signal and a transmission signal before distortion compensation in the path B (step S102). The subtractor 172 then calculates a difference between a feedback signal and a transmission signal before distortion compensation in the path C (step S103). The subtractor 172 then calculates a difference between a feedback signal and a transmission signal before distortion compensation in the path D (step S104).

Subsequently, the SW controller 180 calculates selection time periods of the respective paths based on the calculated differences of the respective paths (step S105). For example, the SW controller 180 may calculate and allocate time periods for selecting signals of the respective paths in the switch 162 in proportion to the magnitudes of the calculated differences of the respective paths. Alternatively, the SW controller 180 may calculate time periods for selecting signals of the respective paths in the switch 162 based on the magnitudes of the calculated differences of the respective paths, but not in proportion to the magnitudes.

Subsequently, the SW controller 180 executes selection (switching) of feedback signals of the respective paths in the switch 162 in accordance with the calculated selection time periods of the respective paths (step S106).

[c] Third Embodiment

Next, a wireless apparatus 300 according to a third embodiment will be described. The wireless apparatus 300 of the third embodiment differs from that of the second embodiment in that adjacent channel leaking power or an ACPR of a feedback signal is used as an index of a magnitude of a distortion. Description of structural components and functions similar to those of the second embodiment will not be repeated.

Figure 9:
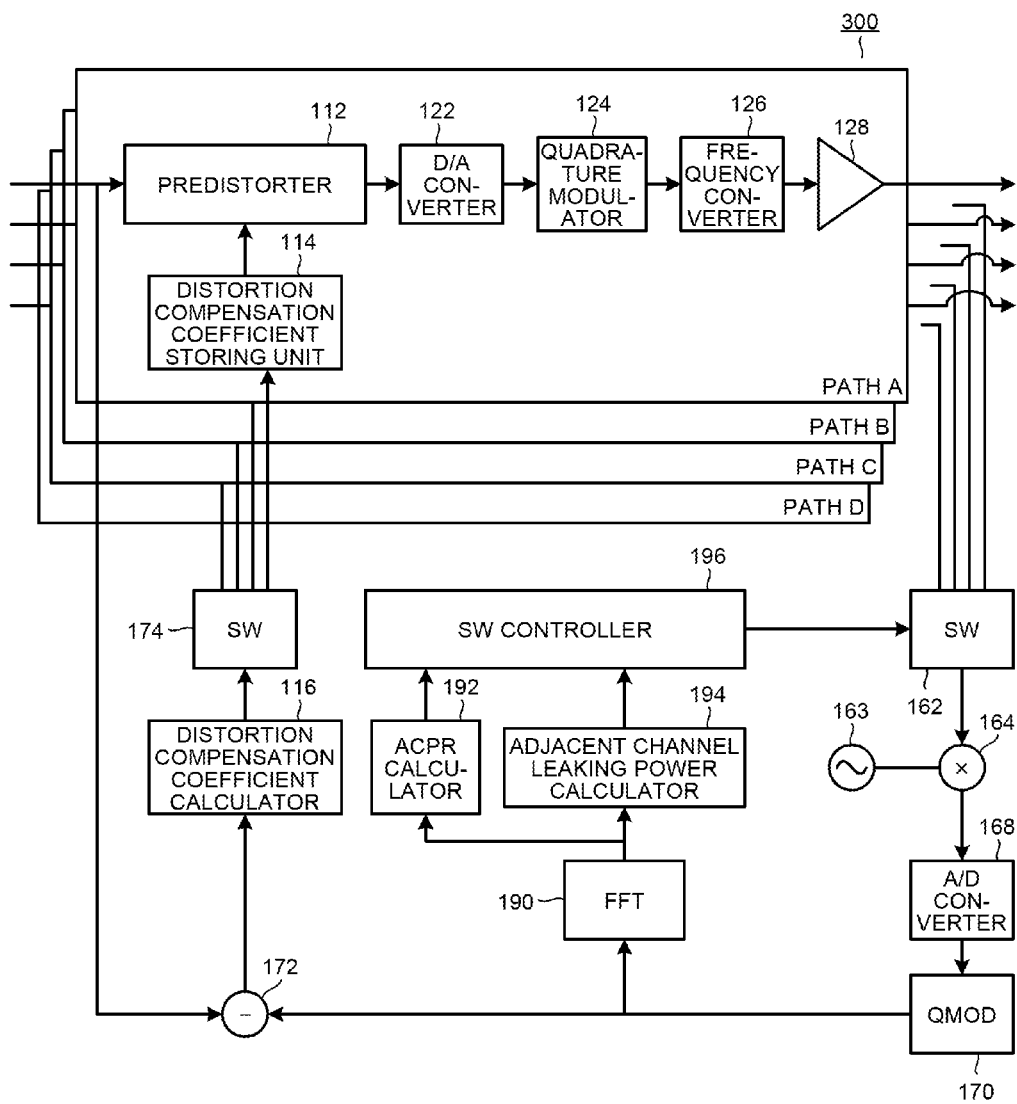
FIG. 9 illustrates an exemplary configuration of a wireless apparatus according to a third embodiment.

FIG. 9 illustrates a configuration of the wireless apparatus 300 according to the third embodiment. As illustrated in FIG. 9, the wireless apparatus 300 includes a Fourier transform unit (FFT (Fast Fourier Transform)) 190, an ACPR calculator 192, an adjacent channel leaking power calculator 194, and an SW controller 196.

The Fourier transform unit 190 performs fast Fourier transform processing on a feedback signal that has been selected in the switch 162 and has thereafter undergone processing in the A/D converter 168 and the modulator 170. Based on a signal output from the Fourier transform unit 190, the ACPR calculator 192 calculates a ratio of power of adjacent channels to power of a main channel for the signal. It is to be noted that, although an example of calculating the ACPR is illustrated in the present embodiment, an ACLR (Adjacent Channel Leakage Ratio) can be used instead of the ACPR.

The adjacent channel leaking power calculator 194 calculates adjacent channel leaking power of the feedback signal that has been selected in the switch 162 and has thereafter undergone processing in the A/D converter 168 and the modulator 170.

The SW controller 196 controls the length of time during which each feedback signal is selected in a time-divisional manner in the switch 162 depending on the magnitude of a distortion of each of a plurality of transmission signals output from a plurality of paths A to D. For example, the SW controller 196 controls the length of time during which each feedback signal is selected in a time-divisional manner in the switch 162 depending on the ratio of power of adjacent channels to power of a main channel for each feedback signal calculated in the ACPR calculator 192. More specifically, the SW controller 196 compares the magnitudes of the ratios of power of adjacent channels to power of a main channel for the respective feedback signals calculated in the ACPR calculator 192. The SW controller 196 then makes the length of time during which a feedback signal is selected in a time-divisional manner in the switch 162 longer for a feedback signal from a path having a larger ratio of power of adjacent channels to power of a main channel. In other words, the SW controller 196 provides a path having a larger power ratio with a larger number of times of updating of the distortion compensation coefficient stored in the distortion compensation coefficient storing unit 114 (LUT).

For example, the SW controller 196 controls the length of time during which each feedback signal is selected in a time-divisional manner in the switch 162 depending on the magnitude of the adjacent channel leaking power of each feedback signal calculated in the adjacent channel leaking power calculator 194. More specifically, the SW controller 196 compares the adjacent channel leaking power values of the respective feedback signals calculated in the adjacent channel leaking power calculator 194. The SW controller 196 then makes a time during which a feedback signal is selected in a time-divisional manner in the switch 162 longer for a feedback signal from a path having a larger adjacent channel leaking power value. In other words, the SW controller 196 provides a path having a larger adjacent channel leaking power value with a larger number of times of updating of the distortion compensation coefficient stored in the distortion compensation coefficient storing unit 114 (LUT).

Figure 10:
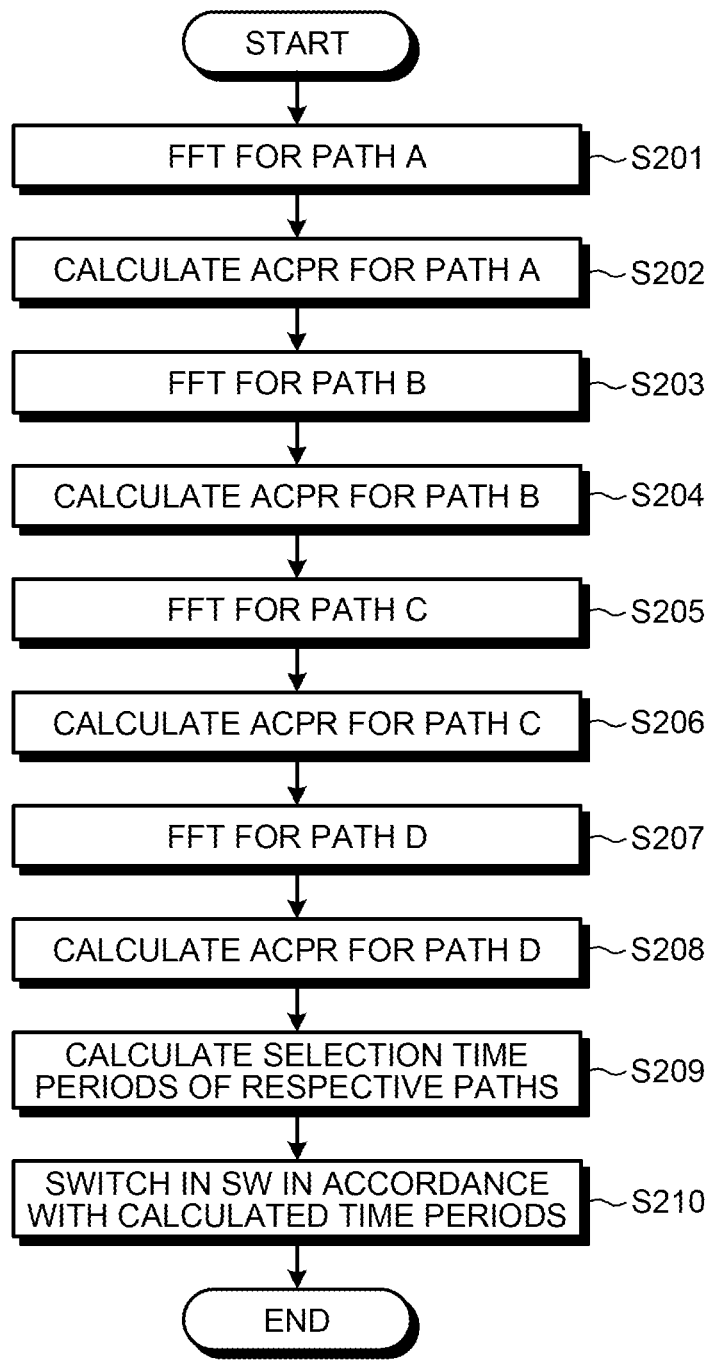
FIG. 10 illustrates a flowchart of an exemplary process performed by the wireless apparatus according to the third embodiment.

Next, a flowchart of an exemplary process performed by the wireless apparatus 300 according to the third embodiment will be described. FIG. 10 illustrates a flowchart of an exemplary process performed by the wireless apparatus 300 according to the third embodiment. As illustrated in FIG. 10, the Fourier transform unit 190 first performs fast Fourier transform on a feedback signal in the path A (step S201). Subsequently, the ACPR calculator 192 calculates a ratio of power of adjacent channels to power of a main channel for the feedback signal in the path A (step S202).

Subsequently, the Fourier transform unit 190 performs fast Fourier transform on a feedback signal in the path B (step S203). Subsequently, the ACPR calculator 192 calculates a ratio of power of adjacent channels to power of a main channel for the feedback signal in the path B (step S204).

Subsequently, the Fourier transform unit 190 performs fast Fourier transform on a feedback signal in the path C (step S205). Subsequently, the ACPR calculator 192 calculates a ratio of power of adjacent channels to power of a main channel for the feedback signal in the path C (step S206).

Subsequently, the Fourier transform unit 190 performs fast Fourier transform on a feedback signal in the path D (step S207). Subsequently, the ACPR calculator 192 calculates a ratio of power of adjacent channels to power of a main channel for the feedback signal in the path D (step S208).

Subsequently, the SW controller 196 calculates selection time periods of the respective paths based on the calculated power ratios of the respective paths (step S209). For example, the SW controller 196 may calculate time periods for selecting the respective paths in the switch 162 in proportion to the magnitudes of the calculated power ratios of the respective paths. Alternatively, the SW controller 196 may calculate time periods for selecting the respective paths in the switch 162 in accordance with the magnitudes of the calculated power ratios of the respective paths but not in proportion to the magnitudes.

Subsequently, the SW controller 196 executes selection (switching) of feedback signals of the respective paths in the switch 162 in accordance with the calculated selection time periods of the respective paths (step S210).

Next, a flowchart of another exemplary process performed by the wireless apparatus 300 according to the third embodiment will be described. FIG. 11 illustrates a flowchart of another exemplary process performed by the wireless apparatus 300 according to the third embodiment. As illustrated in FIG. 11, the Fourier transform unit 190 first performs fast Fourier transform on a feedback signal in the path A (step S301). Subsequently, the adjacent channel leaking power calculator 194 calculates adjacent channel leaking power for the feedback signal in the path A (step S302).

Subsequently, the Fourier transform unit 190 performs fast Fourier transform on a feedback signal in the path B (step S303). Subsequently, the adjacent channel leaking power calculator 194 calculates adjacent channel leaking power for the feedback signal in the path B (step S304).

Subsequently, the Fourier transform unit 190 performs fast Fourier transform on a feedback signal in the path C (step S305). Subsequently, the adjacent channel leaking power calculator 194 calculates adjacent channel leaking power for the feedback signal in the path C (step S306).

Subsequently, the Fourier transform unit 190 performs fast Fourier transform on a feedback signal in the path D (step S307). Subsequently, the adjacent channel leaking power calculator 194 calculates adjacent channel leaking power for the feedback signal in the path D (step S308).

Subsequently, the SW controller 196 calculates selection time periods of the respective paths based on the calculated adjacent channel leaking power values of the respective paths (step S309). For example, the SW controller 196 may calculate time periods for selecting the respective paths in the switch 162 in proportion to the magnitudes of the calculated adjacent channel leaking power values of the respective paths. Alternatively, the SW controller 196 may calculate time periods for selecting signals of the respective paths in the switch 162 in accordance with the magnitudes of the calculated adjacent channel leaking power values of the respective paths, but not in proportion to the magnitudes.

Subsequently, the SW controller 196 executes selection (switching) of feedback signals of the respective paths in the switch 162 in accordance with the calculated selection time periods of the respective paths (step S310).

As described above, the wireless apparatuses according to the embodiments include a plurality of amplifiers, monitor magnitudes of distortions of signals output from the respective amplifiers, and control the switching time periods of feedback signals in accordance with the magnitudes. For example, the wireless apparatus 200 controls the switch 162 so that update in the LUT may be performed for a longer time period for a path including an amplifier having a large distortion than for a path including an amplifier having a small distortion. As a result, sufficient distortion compensation is performed for the path experiencing a large distortion. On the other hand, update of the distortion compensation coefficient is not performed frequently for the signal of the path having a small distortion. Because the signal of such path experiences almost no distortion from the beginning, an influence on adjacent channels is restricted. Thus, according to the wireless apparatuses of the embodiments, it is possible to shorten the time for distortion compensation in the apparatus as a whole.

According to an embodiment, time taken for distortion compensation of signals output from a plurality of amplifiers can be shortened.

Further, the process performed by the wireless apparatus according to an embodiment may be stored, as a computer program, in a computer-readable storage medium such as floppy disk, CD-ROM (compact disc read only memory), DVD (digital versatile disc), magnet-optical disc and IC card. The program may be read from the computer-readable storage medium and executed by a computer.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless apparatus comprising:
    a plurality of amplifying systems each including:
        a storing unit that stores a distortion compensation coefficient for use in compensation for a nonlinear distortion of one or more transmission signals;
        a compensator that compensates for the nonlinear distortion of the transmission signal with use of the distortion compensation coefficient stored in the storing unit; and
        an amplifier that amplifies the transmission signal subjected to the distortion compensation in the compensator;
    a switch that selects a plurality of feedback signals corresponding to the plurality of transmission signals output from the plurality of amplifying systems sequentially in a time-divisional manner;
    a subtractor that derives one or more differences between the feedback signal selected in the switch and the transmission signal, corresponding to the feedback signal, before the distortion compensation in the compensator;
    a first calculator that derives a distortion compensation coefficient that restricts the difference derived in the subtractor and updates the distortion compensation coefficient stored in the storing unit in the corresponding amplifying system by the derived distortion compensation coefficient; and a switch controller that controls the length of time during which each of the feedback signals is selected in the time-divisional manner in the switch depending on a magnitude of the distortion of each of the plurality of transmission signals output from the plurality of amplifying systems, the switch controller comparing the plurality of differences corresponding to the plurality of feedback signals derived in the subtractor with one another and causing the length of time during which the feedback signal is selected in the time-divisional manner to be longer for the feedback signal from the amplifying system having the larger difference.

2. A wireless apparatus comprising:

a plurality of amplifying systems each including:

a storing unit that stores a distortion compensation coefficient for use in compensation for a nonlinear distortion of one or more transmission signals;

a compensator that compensates for the nonlinear distortion of the transmission signal with use of the distortion compensation coefficient stored in the storing unit; and an amplifier that amplifies the transmission signal subjected to the distortion compensation in the compensator;

a switch that selects a plurality of feedback signals corresponding to the plurality of transmission signals output from the plurality of amplifying systems sequentially in a time-divisional manner;

a subtractor that derives one or more differences between the feedback signal selected in the switch and the transmission signal, corresponding to the feedback signal, before the distortion compensation in the compensator;

a first calculator that derives a distortion compensation coefficient that restricts the difference derived in the subtractor and updates the distortion compensation coefficient stored in the storing unit in the corresponding amplifying system by the derived distortion compensation coefficient;

a second calculator that calculates adjacent channel leaking power values of the respective feedback signals based on the plurality of feedback signals; and a switch controller that controls the length of time during which each of the feedback signals is selected in the time-divisional manner in the switch depending on a magnitude of the distortion of each of the plurality of transmission signals output from the plurality of amplifying systems, the switch controller also controls the length of time during which each of the feedback signals is selected in the time-divisional manner depending on a magnitude of the adjacent channel leaking power values of each of the feedback signals calculated in the second calculator.

3. The wireless apparatus according to claim 2, wherein the switch controller compares the adjacent channel leaking power values of the respective feedback signals calculated in the second calculator and causes the length of time during which the feedback signal is selected in the time-divisional manner in the switch to be longer for the feedback signal from the amplifying system having the larger adjacent channel leaking power value.

4. A wireless apparatus comprising:

a plurality of amplifying systems each including:

a storing unit that stores a distortion compensation coefficient for use in compensation for a nonlinear distortion of one or more transmission signals;

a compensator that compensates for the nonlinear distortion of the transmission signal with use of the distortion compensation coefficient stored in the storing unit; and an amplifier that amplifies the transmission signal subjected to the distortion compensation in the compensator;

a switch that selects a plurality of feedback signals corresponding to the plurality of transmission signals output from the plurality of amplifying systems sequentially in a time-divisional manner;

a subtractor that derives one or more differences between the feedback signal selected in the switch and the transmission signal, corresponding to the feedback signal, before the distortion compensation in the compensator;

a first calculator that derives a distortion compensation coefficient that restricts the difference derived in the subtractor and updates the distortion compensation coefficient stored in the storing unit in the corresponding amplifying system by the derived distortion compensation coefficient;

a third calculator that calculates ratios of power of adjacent channels to power of a main channel for the respective feedback signals based on the plurality of feedback signals; and a switch controller that controls the length of time during which each of the feedback signals is selected in the time-divisional manner in the switch depending on a magnitude of the distortion of each of the plurality of transmission signals output from the plurality of amplifying systems, the switch controller also controls the length of time during which each of the feedback signals is selected in the time-divisional manner depending on the ratios calculated in the third calculator.

5. The wireless apparatus according to claim 4, wherein the switch controller compares magnitudes of the ratios of the power of the adjacent channels to the power of the main channel for the respective feedback signals calculated in the third calculator and causes the length of time during which the feedback signal is selected in the time-divisional manner in the switch to be longer for the feedback signal from the amplifying system having the larger ratio of the power of the adjacent channels to the power of the main channel.

6. A distortion compensating method comprising:

(a) executing in each of a plurality of amplifying systems:

(a1) reading a distortion compensation coefficient from a storing unit that stores the distortion compensation coefficient for use in compensation for a nonlinear distortion of one or more transmission signals and compensating for the nonlinear distortion of the transmission signal with use of the read distortion compensation coefficient; and (a2) amplifying the transmission signal subjected to the distortion compensation;

(b) selecting a plurality of feedback signals corresponding to the plurality of transmission signals output from the plurality of amplifying systems sequentially in a time-divisional manner;

(c) deriving a difference between the selected feedback signal and the transmission signal, corresponding to the feedback signal, before the distortion compensation;

(d) deriving a distortion compensation coefficient that restricts the derived difference and updating the storing unit in the corresponding amplifying system by the derived distortion compensation coefficient; and (e) controlling the length of time during which each of the feedback signals is selected in the time-divisional manner depending on a magnitude of the distortion of each of the plurality of transmission signals output from the plurality of amplifying systems, by comparing a plurality of differences derived in the (c) deriving and corresponding to the plurality of feedback signals selected in the (b) selecting with one another and causing the length of time during which the feedback signal is selected in the time-divisional manner to be longer for the feedback signal from the amplifying system having the larger difference.

7. A distortion compensating method comprising:
(a) executing in each of a plurality of amplifying systems:
  (a1) reading a distortion compensation coefficient from a storing unit that stores the distortion compensation coefficient for use in compensation for a nonlinear distortion of one or more transmission signals and compensating for the nonlinear distortion of the transmission signal with use of the read distortion compensation coefficient; and
  (a2) amplifying the transmission signal subjected to the distortion compensation;
(b) selecting a plurality of feedback signals corresponding to the plurality of transmission signals output from the plurality of amplifying systems sequentially in a time-divisional manner;
(c) deriving a difference between the selected feedback signal and the transmission signal, corresponding to the feedback signal, before the distortion compensation;
(d) deriving a distortion compensation coefficient that restricts the derived difference and updating the storing unit in the corresponding amplifying system by the derived distortion compensation coefficient;
(e) calculating adjacent channel leaking power values of the respective feedback signals based on the plurality of feedback signals; and
(f) controlling the length of time during which each of the feedback signals is selected in the time-divisional manner depending on a magnitude of the distortion of each of the plurality of transmission signals output from the plurality of amplifying systems, and also controlling the length of time during which each of the feedback signals is selected in the time-divisional manner depending on a magnitude of the adjacent channel leaking power values of each of the feedback signals calculated in the (e) calculating.

8. The distortion compensating method according to claim 7, wherein the (f) controlling controls the length of time by comparing the adjacent channel leaking power values of the respective feedback signals calculated in the (e) calculating and causing the length of time during which the feedback signal is selected in the time-divisional manner to be longer for the feedback signal from the amplifying system having the larger adjacent channel leaking power value.

9. A distortion compensating method comprising:
(a) executing in each of a plurality of amplifying systems:
  (a1) reading a distortion compensation coefficient from a storing unit that stores the distortion compensation coefficient for use in compensation for a nonlinear distortion of one or more transmission signals and compensating for the nonlinear distortion of the transmission signal with use of the read distortion compensation coefficient; and
  (a2) amplifying the transmission signal subjected to the distortion compensation;
(b) selecting a plurality of feedback signals corresponding to the plurality of transmission signals output from the plurality of amplifying systems sequentially in a time-divisional manner;
(c) deriving a difference between the selected feedback signal and the transmission signal, corresponding to the feedback signal, before the distortion compensation;
(d) deriving a distortion compensation coefficient that restricts the derived difference and updating the storing unit in the corresponding amplifying system by the derived distortion compensation coefficient;
(e) calculating ratios of power of adjacent channels to power of a main channel for the respective feedback signals based on the plurality of feedback signals; and
(f) controlling the length of time during which each of the feedback signals is selected in the time-divisional manner depending on a magnitude of the distortion of each of the plurality of transmission signals output from the plurality of amplifying systems, and also controlling the length of time during which each of the feedback signals is selected in the time-divisional manner depending on the ratios calculated in the (e) calculating.

10. The distortion compensating method according to claim 9, wherein the (f) controlling controls the length of time by comparing magnitudes of the ratios of the power of the adjacent channels to the power of the main channel for the respective feedback signals calculated in the (e) calculating and causing the length of time to be longer for the feedback signal from the amplifying system having the larger ratio of the power of the adjacent channels to the power of the main channel.

* * * * *